United States Patent
Devan et al.

(10) Patent No.: US 9,035,938 B2
(45) Date of Patent: May 19, 2015

(54) GENERATING CROSS SECTION FOR ROADWAY INFRASTRUCTURE MODELS

(75) Inventors: Anandaraja Devan, Belmont, MA (US); Nicholas James Zeeben, Goffstown, NH (US); Chakravarthy Gavini, Amherst, NH (US); John Murchie Lewis, Acton, MA (US)

(73) Assignee: Autodesk, Inc., San Rafael, CA (US)

( * ) Notice: Subject to any disclaimer, the term of this patent is extended or adjusted under 35 U.S.C. 154(b) by 752 days.

(21) Appl. No.: 13/269,335

(22) Filed: Oct. 7, 2011

(65) Prior Publication Data

US 2013/0090893 A1  Apr. 11, 2013

(51) Int. Cl.
*G06F 17/00* (2006.01)
*G06F 17/50* (2006.01)

(52) U.S. Cl.
CPC .................................. *G06F 17/5004* (2013.01)

(58) Field of Classification Search
CPC .................................................. G06F 17/5004
See application file for complete search history.

(56) References Cited

U.S. PATENT DOCUMENTS 7,324,102 B2 * 1/2008 Inzinga et al. ................ 345/419
7,639,267 B1 * 12/2009 Desimone et al. ............ 345/619

OTHER PUBLICATIONS

Ballard, D.H., "Strip Trees: A Hierarchical Representation for Curves"; Communications of the ACM, vol. 24, No. 5 (May 1981), p. 310-321.

* cited by examiner

*Primary Examiner* — Kee M Tung
*Assistant Examiner* — Frank Chen
(74) *Attorney, Agent, or Firm* — Gates & Cooper LLP

(57) ABSTRACT

A method, system, apparatus, article of manufacture, and computer-program product provides the ability to generate a cross section for a roadway infrastructure model. A cutting plane line is drawn on the roadway infrastructure model at an arbitrary location. Portions of the roadway infrastructure model that intersect the cutting plane line are determined. Solids are created at the intersections. A cross section is formed by slicing the one or more solids based on the cutting plane line. The cross section is displayed.

24 Claims, 10 Drawing Sheets

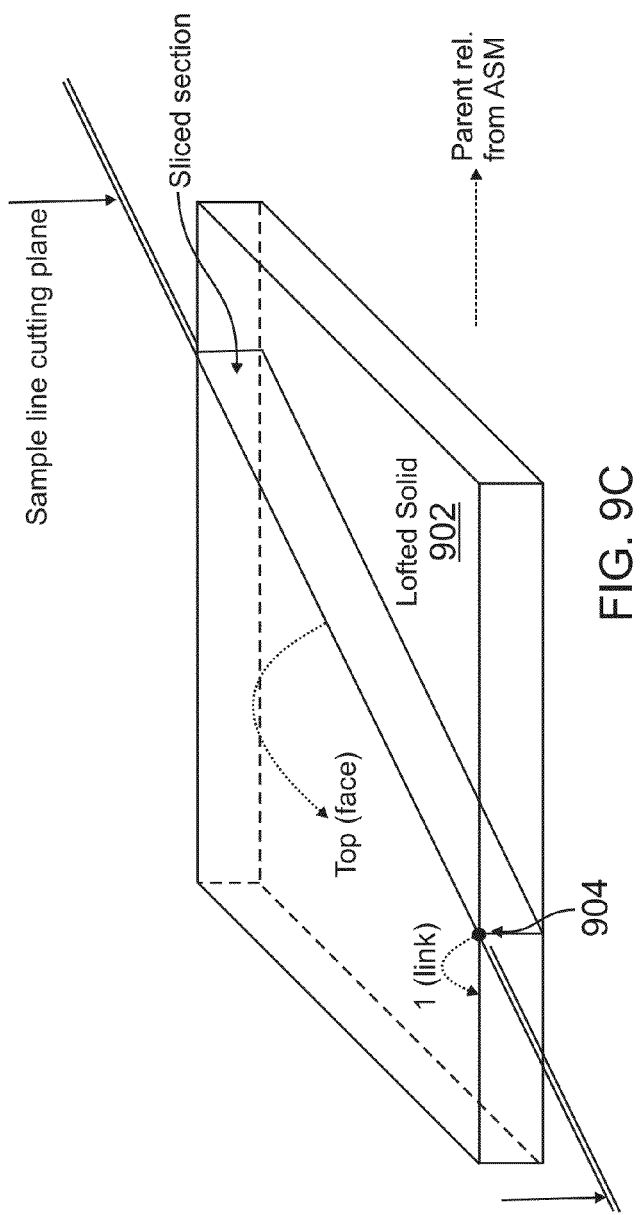

GENERATING CROSS SECTION FOR ROADWAY INFRASTRUCTURE MODELS

BACKGROUND OF THE INVENTION

1. Field of the Invention

The present invention relates generally to modeling applications, and in particular, to a method, apparatus, and article of manufacture for creating and displaying detailed cross-sectional views in a roadway infrastructure model along arbitrary directions and across multi-segment paths simultaneously.

2. Description of the Related Art

Roadway infrastructure is typically modeled in software applications by building cross sections along a pathway. Cross sections may be designed at regular intervals along an alignment and the road model encapsulates this information to present a three-dimensional (3D) model to the user. In some situations such as roundabouts, cross sections along multiple paths may be part of the same roadway model.

As a part of the design process, civil engineers routinely create cross sectional views of the road model at various locations for model investigation and documentation purposes. It is easy to create a sectional view along one of the designed sections since it involves reproducing the designed section. Ordinarily, these cross sectional views are created by using an object that represents a cutting tool. The cutting tool represents where the cross sectional view will be created and in prior art implementations must be aligned parallel to cross sections as they exist in the drawing.

Frequently users would like to create a sectional view that does not coincide with the designed cross section. Examples include roadway intersections, models of cul-de-sacs, roundabouts, off ramps etc. In some of these examples, the cutting plane will not align with a cross section in the roadway model which means that a cross section cannot be created.

Another deficiency in the prior art relates to the creation of a cross section view where the ends of the cutting tool used to create the cross sectional view fall within or between two cross sections. In other words, the newly designed cross section does not extend through the roadway cross section, but falls within the roadway. The prior art solves such problems by adding a design cross section if it aligns with the cutting plane.

Accordingly, it may be noted that prior art design applications do not support cutting sections in cases where the cutting plane does not align with a designed cross section. Instead, a layered based approach is utilized. In this regard, typically, roadway infrastructure models consist of various layers (e.g., pavement layer, gravel layer, subbase layer, etc.). Prior art procedures involve creating a DTM (digital terrain model) surface for the top of each layer. Thereafter, to represent each layer, users create a delta surface between the two layers that enclose it. However, such a procedure requires significant user effort and is therefore not desirable.

In other words, when users design roadways, it is not possible to design every aspect of the road (e.g., that is several miles long). Accordingly, cross sections are designed at large intervals (e.g., every one hundred [100] feet) and the designer specifies how the cross section looks at each cross section. However, no information is defined at intermediate locations between the cross sections. Nonetheless, it is desirable for users to cut sections along arbitrary planes—in planes that do not align with the designed cross sections. Further, some cross sections may be organized to form complicated shapes (e.g., roundabouts, highway off-ramps, etc.). Prior art systems were only able to display the information at the specifically designed cross sections. Further, users had to create derivatives of a model in order to display cross sections accurately (e.g., a surface was created from a model, and the newly created surface was displayed in the cross section).

In view of the above, it is desirable to provide a means to generate section views of roadway infrastructure models along arbitrary directions (cutting planes) and also across multiple-segment paths (alignments) simultaneously. In addition, it is desirable to provide a methodology to generate fully capable 3D solids for infrastructure models.

SUMMARY OF THE INVENTION

Embodiments of the invention overcome the problems of the prior art by generating and displaying a cross section of a roadway infrastructure at an arbitrary location/direction that may cross multiple-segment paths simultaneously. To provide such capabilities, a user specifies a location for a cutting plane (e.g., by drawing a cutting plane line). Such a location may be at an arbitrary location that does not align with pre-defined/regularly occurring cross sections. Further, the location may cross multiple-segment paths (e.g., a cul-de-sac, a round-about, etc.).

Thereafter, further user interaction is not necessary as the system automatically and without additional user input, creates, accurately labels, and displays points, lines/edges, faces, and solids at the desired cross section location. The first step in this process, determines (i.e., based on various methods) where the location of the cutting plane line intersects with the roadway model. Based on the determination, solid models are created at the points of intersection. For example, the solid models may be interpolated based on regularly occurring cross sections. The newly created cross sections are then sliced based on the cutting plane line with the result displayed. Further, parts/components of the cross section (e.g., points, lines/edges, faces, and solids) inherit the labels based on parent relations (e.g., from the solids/cross sections on which the newly created solids are based).

BRIEF DESCRIPTION OF THE DRAWINGS

Referring now to the drawings in which like reference numbers represent corresponding parts throughout:

FIG. 9C illustrates a cut of a cross section of FIGS. 9A and 9B that acquires a label based on a parent relationship in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide a roadway model that models building cross sections and presents a 3D model to the user. In this regard, cross sections of roadway models may be viewed along arbitrary cutting planes. Further, embodiments enable a mechanism for viewing cross sections of roadway models across multiple control paths using a single cutting plane.

Hardware Environment

Figure 1:
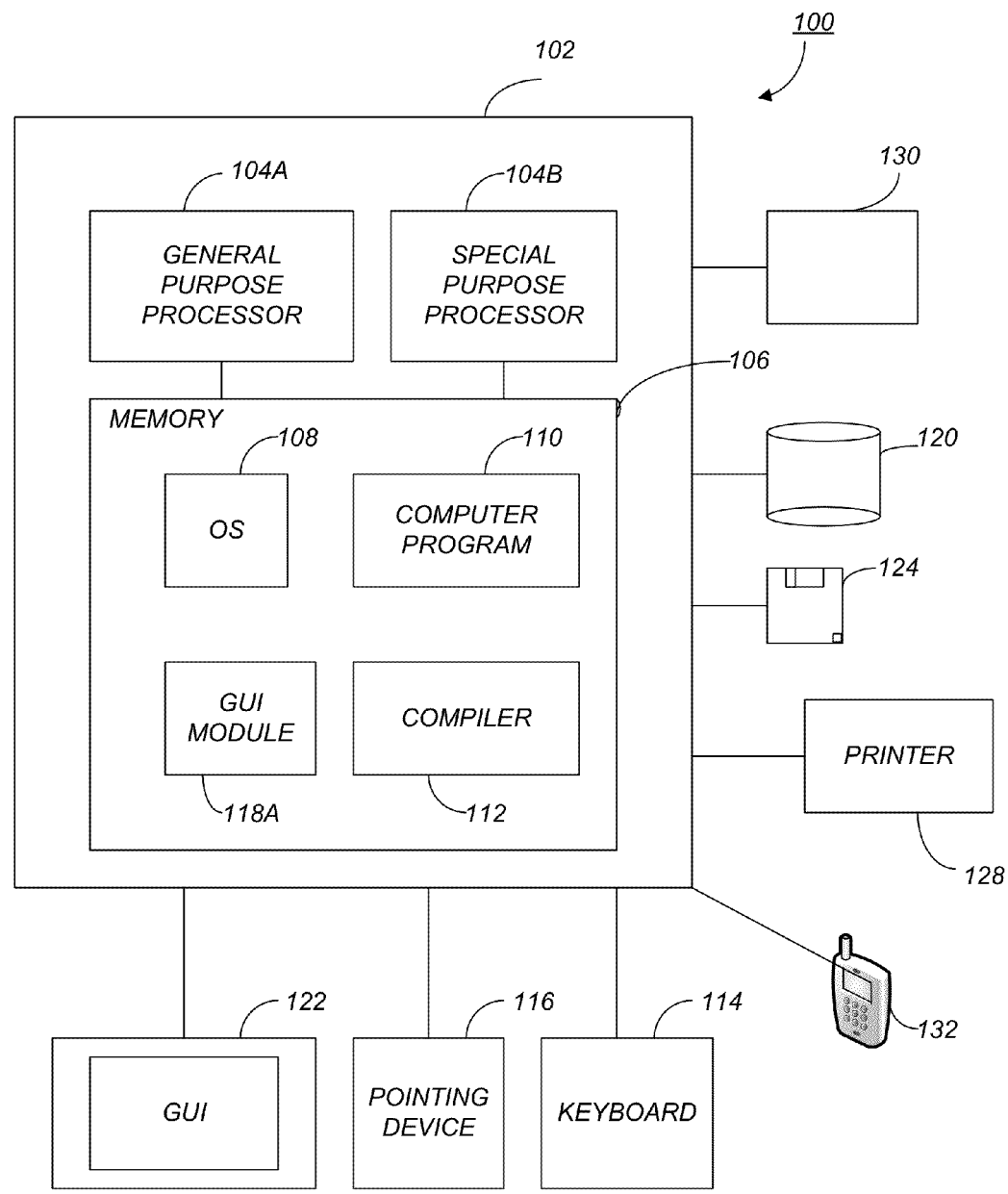
FIG. 1 is an exemplary hardware and software environment 100 used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to integrated with other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to or may comprise a portable or media viewing/listening device 132 (e.g., an MP3 player, iPod™, Nook™, portable digital video player, cellular device, personal digital assistant, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of a multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 2:
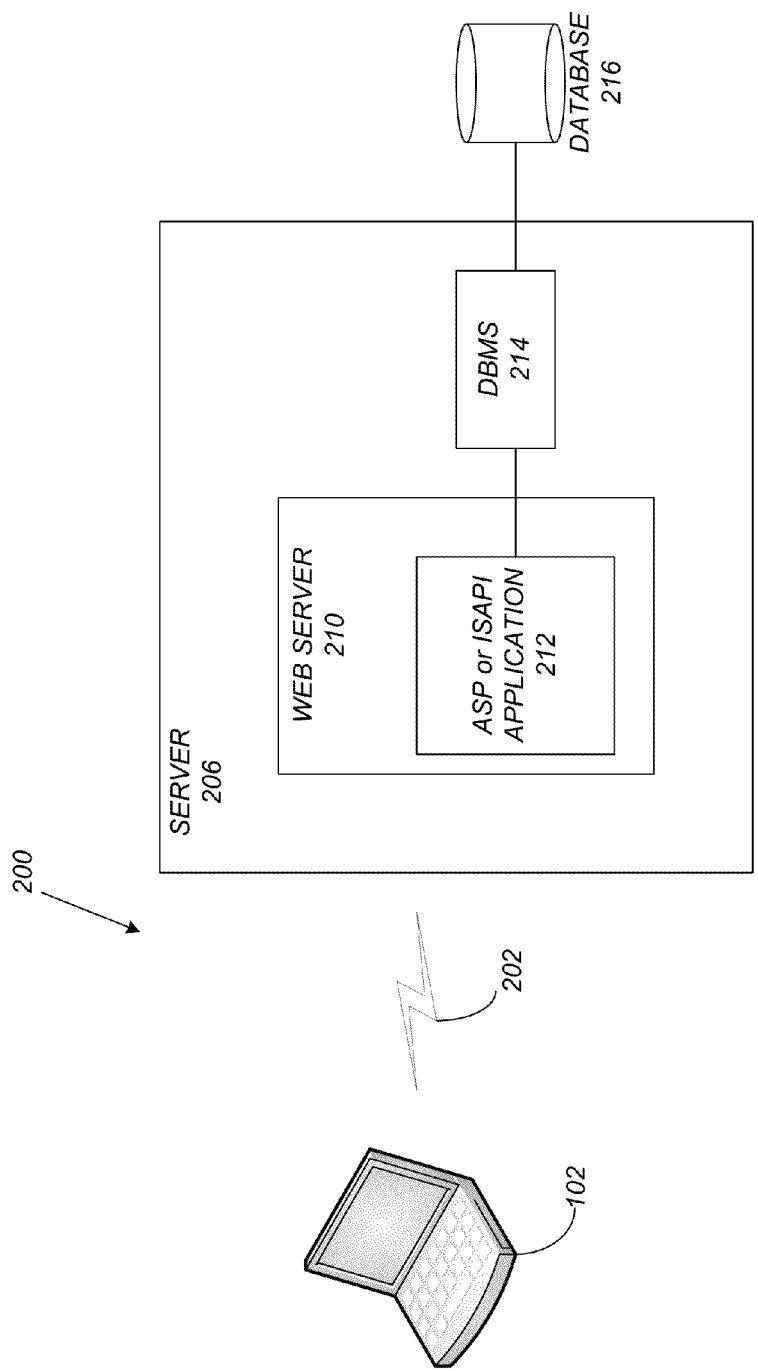
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1).

A network 202 such as the Internet connects clients 102 to server computers 206. Network 202 may utilize ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of or connected directly to client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 102 and 206 may include thin client devices with limited or full processing capabilities, portable devices such as cell phones, notebook computers, pocket computers, multi-touch devices, and/or any other device with suitable processing, communication, and input/output capability.

Of course, those skilled in the art will recognize that any combination of the above components, or any number of different components, peripherals, and other devices, may be used with computers 102 and 206.

Software Embodiment Overview

Embodiments of the invention are implemented as a software application on a client 102 or server computer 206. Further, as described above, the client 102 or server computer 206 may comprise a thin client device or a portable device that has a multi-touch-based display.

The software application provides a roadway model that models building cross sections and presents a 3D model to the user. In this regard, embodiments of the invention allow the viewing of cross sections of roadway models along arbitrary cutting planes. Further, embodiments enable a mechanism for viewing cross sections of roadway models across multiple control paths using a single cutting plane. Such capability enables the creation of sectional views for geometrically complicated models (e.g., roundabouts, roadway intersections, off ramps, etc.). The techniques described herein can be used in any type of software application that maintains models as a series of cross sections along a path to create sectional views.

Figure 3:
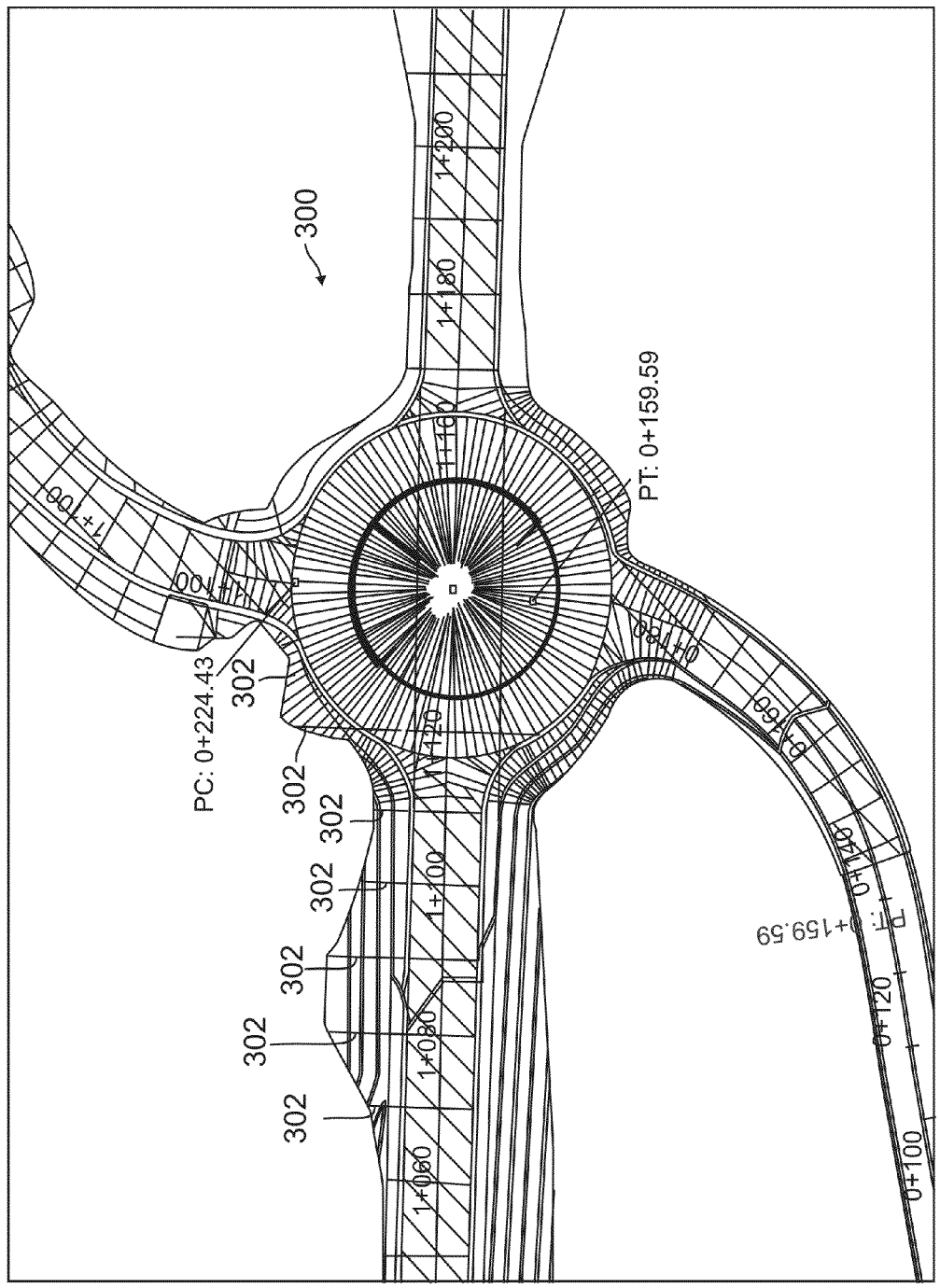
FIG. 3 shows a roundabout in plan view in accordance with one or more embodiments of the invention.

FIG. 3 shows a roundabout in plan view in accordance with one or more embodiments of the invention. Lines 302 indicate the cross sections that have been created as part of the road model. If the user desires to view the model 300 in 3D, one part of the road can be selected and the user may zoom in.

Figure 4:
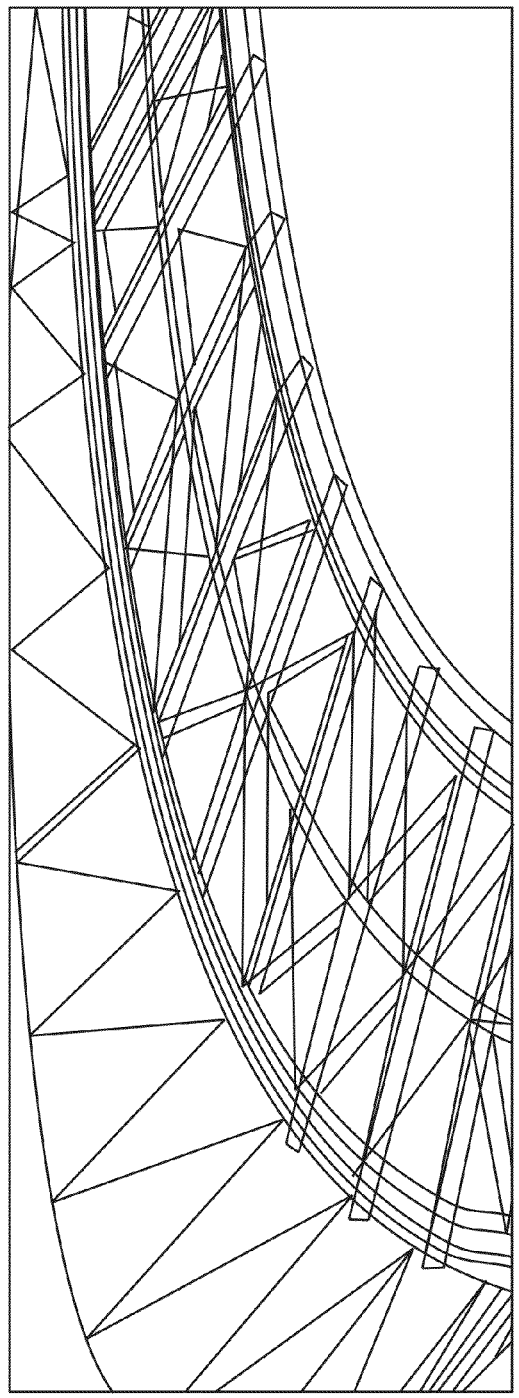
FIG. 4 shows a 3D view of a portion of the model of FIG. 3 in accordance with one or more embodiments of the invention.

FIG. 4 shows a 3D view of a portion of the model of FIG. 3. Notice the individual cross sections that have been created at regular intervals along the alignment. The different shades in the lines illustrate the different layers of the road.

Figure 5B:
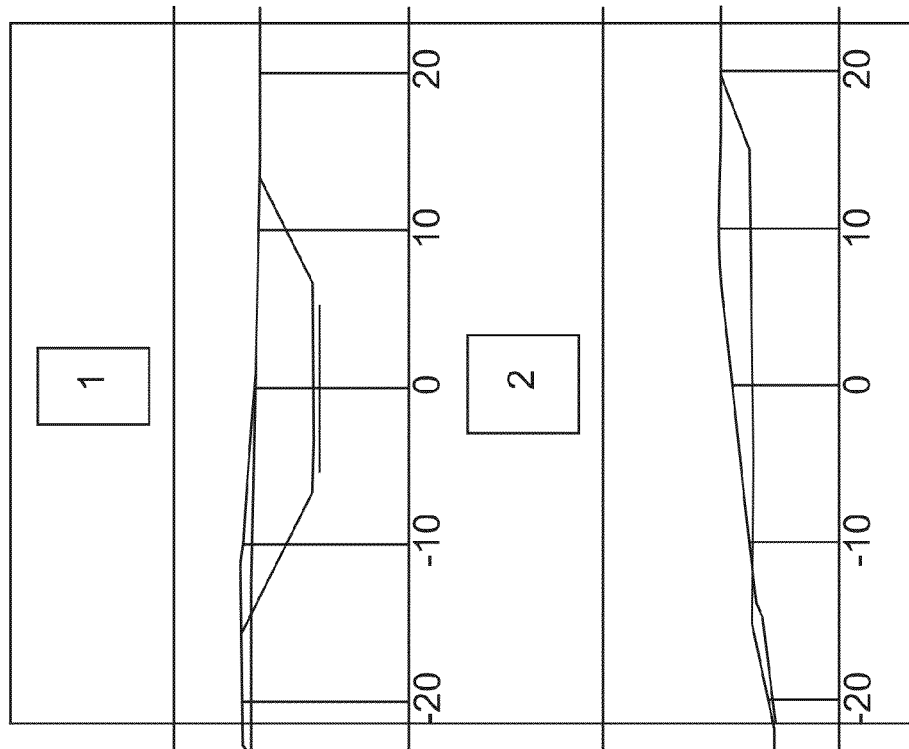
FIG. 5 illustrates cross section views that have been created for two cases—FIG. 5A (left) illustrates a plan view with two cutting planes line shown and FIG. 5B (right) illustrates the corresponding section views in accordance with one or more embodiments of the invention.
Figure 5A:
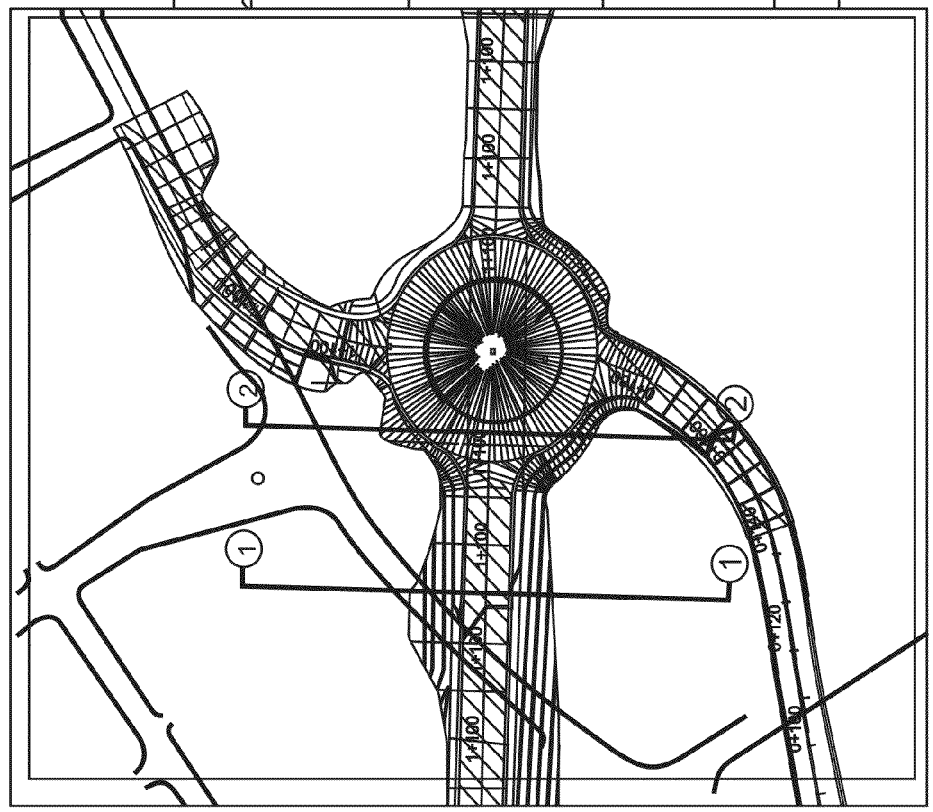

To demonstrate the change in behavior for different cross sections, FIG. 5 illustrates cross section views that have been created for two cases—FIG. 5A (left) illustrates a plan view with the cutting plane line shown and FIG. 5B (right) illustrates the corresponding section views. Line 1-1 illustrates a cross section at a location where the cutting plane coincides with an existing model cross section. Line 2-2 illustrates a cross section at a location where the cutting plane would not align with existing roundabout cross sections. As cross section 1-1 lines up with an existing cross section, the information/details/layers can be seen in the section view. However, since section 2-2 does not align with a cross section of the roundabout model, section 2-2 in FIG. 5B does not show any detail of the model. Such differences illustrate the problem of the prior art. Accordingly, embodiments of the invention need to create a 3D representation that displays the layers and details of non-aligned cross sections.

Figure 6:
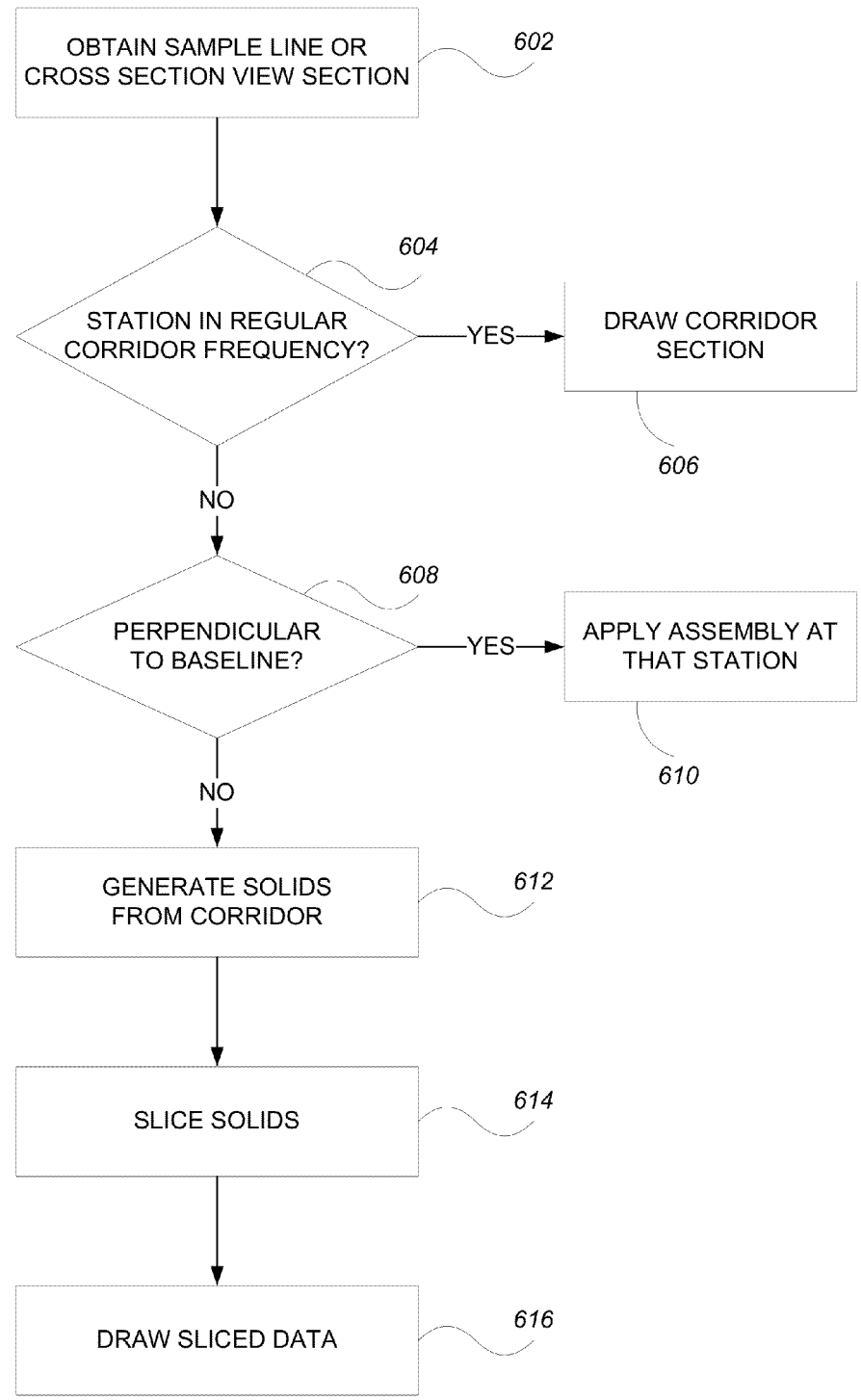
FIG. 6 is a flow chart illustrating the logical flow for generating a cross section for roadway infrastructure models in accordance with one or more embodiments of the invention.

In view of the above, when a user elects to create a cross/cut section, embodiments of the invention process the model and try to create a section where desired. FIG. 6 is a flow chart illustrating the logical flow for generating a cross section for roadway infrastructure models in accordance with one or more embodiments of the invention.

At step 602, a sample line or CSV (cross section viewer) section is obtained. In other words, the user marks a cutting plane (e.g., by typing/entering a command to create a cross/cut section).

At step 604, a determination is made regarding whether the station is in a regular corridor frequency. In other words, the system checks to determine if the location being cut (i.e., the location of the sample line or CSV section) is at a calculated/already calculated station/cross section.

If the new section is at a regular corridor (i.e., at an already created cross-section) (e.g., line 1-1 of FIG. 5A), the corridor section is drawn at step 606.

However, if the new section does not coincide with an already existing cross section, the process continues at step 608 where a determination is made regarding whether the sample line or CSV section is perpendicular to the baseline. In other words, the system examines the perpendicularity of the sample line with respect to remaining parts of the drawing (e.g., wherever the user is drawing the cutting plane). If the alignment of the roadway is perpendicular to the baseline, the assembly is applied at that station at step 610. To apply the assembly, a cross section is created and added to the design at this location. Thus, in addition to the cross sections that are regularly spaced, the model will now have this additional cross section.

If the sample line or CSV section is not perpendicular to the base line, solids are generated from the corridor at step 612, the solids are sliced at step 614, and the slice data is drawn with labels at step 616. Thus, the determination at step 608 (for perpendicularity) determines if a roadway has a different geometry from a straight standard road. An example of such a different geometry is if the new cross section covers more than one roadway model (e.g., a freeway with a divided highway with lanes on two sides separated by a graph median). In such a situation, embodiments of the invention actually generate solids (at step 612), slice the solids at the points of intersection (at step 614), and then draw the slice data accordingly (at step 616).

The above steps may be examined with respect to FIGS. 5A and 5B. In this regard, a cutting plane is marked by a user (e.g., using a command to create a cross/cut section such as line 1-1 or 2-2). If the cutting plane is at a regular frequency (e.g., line 1-1), the section is simply drawn at step 606. However, if not at a regular frequency (e.g., line 2-2), the system runs through the model and when attempting to create a section across line 2-2, a solid is created at those locations on the road that intersect with line 2-2. First, the system finds where the cutting plane (i.e., line 2-2) intersects with the road. Thereafter, at step 612, a solid is created for those portions to be displayed in a corresponding 3D view. Those solids are then sliced at step 614 and drawn at step 616.

Figure 7B:
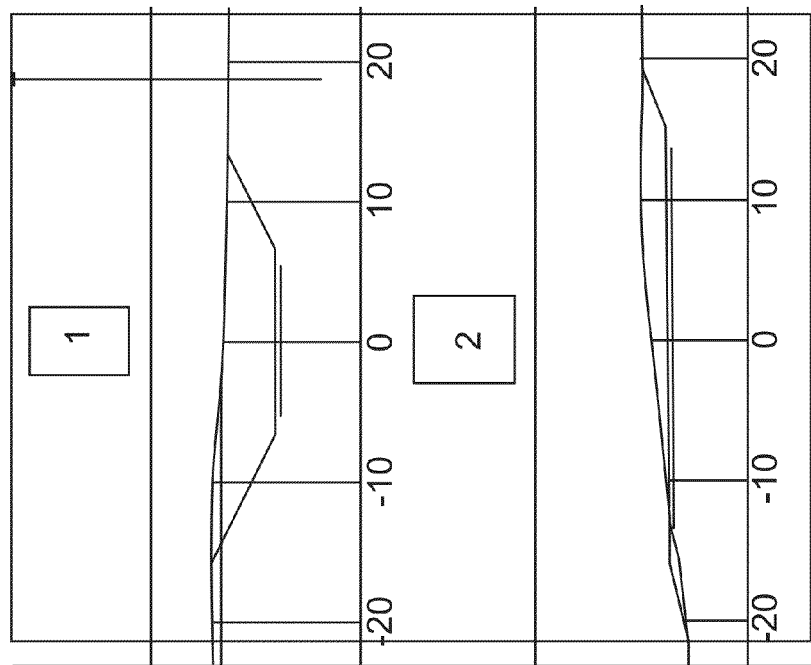
FIGS. 7A and 7B illustrate cross section views using aligned and non-aligned cross sections respectively in accordance with one or more embodiments of the invention.
Figure 7A:
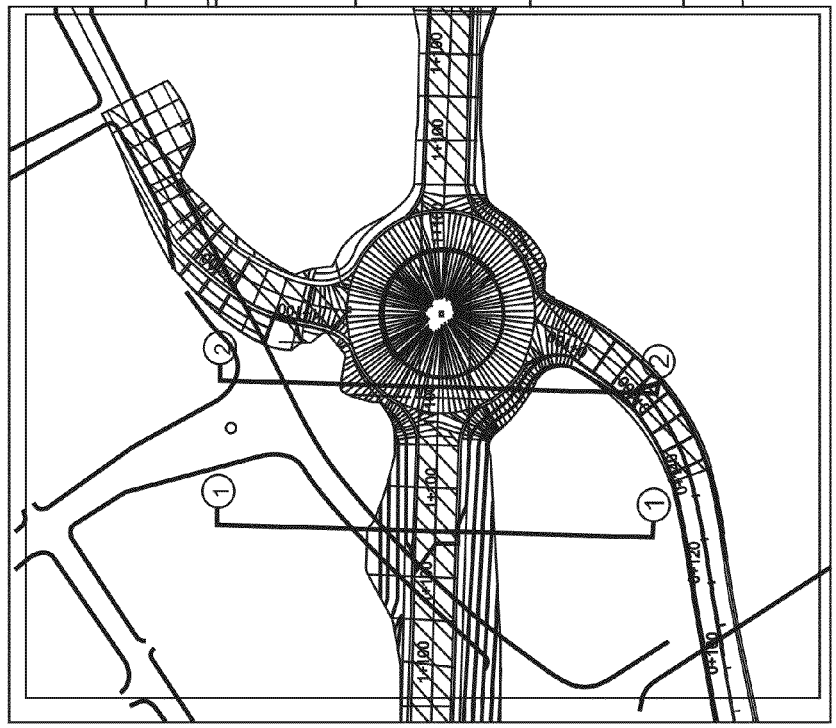

FIGS. 7A and 7B illustrate cross section views using aligned and non-aligned cross sections respectively in accordance with one or more embodiments of the invention. As illustrated, in FIG. 7B (compared to that of FIG. 5B), the complete cross section of the roundabout model can be viewed using cutting plane 2-2.

Figure 8:
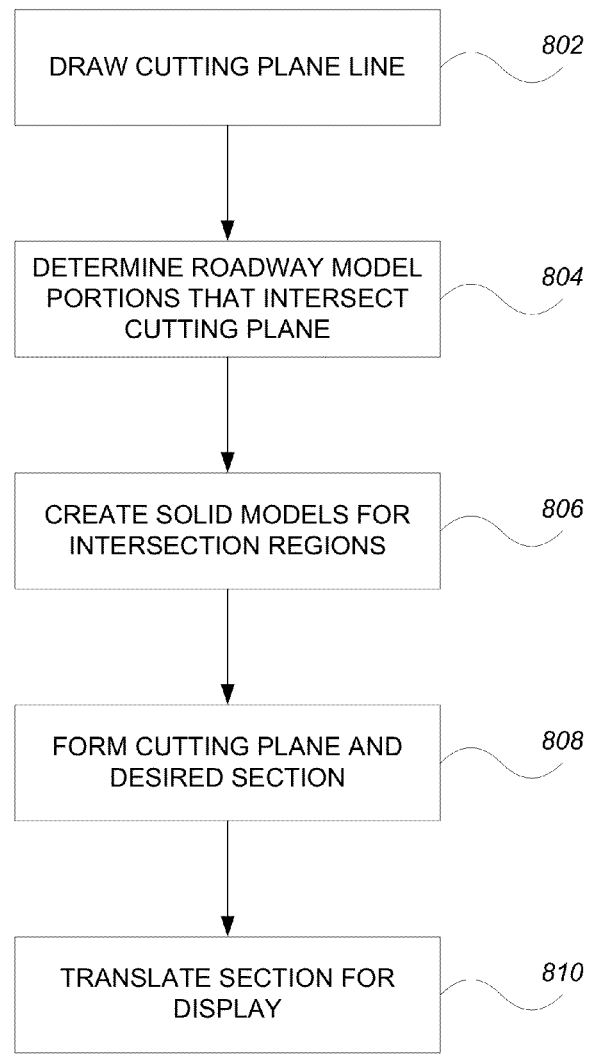
FIG. 8 is a flow chart illustrating further details regarding the creation of an intermediate cross-section in accordance with one or more embodiments of the invention.

FIG. 8 is an additional flow chart illustrating further details regarding the creation of an intermediate cross-section in accordance with one or more embodiments of the invention. At step 802, a cutting plane line is drawn where desired by the user (e.g., line 1-1 or 2-2).

At step 804, portions of the roadway model that intersect the cutting plane line are determined. Spatial partitioning along the roadway alignment may be used to perform this determination. As part of the above process in both the flow charts of FIGS. 6 and 8, one determination that must be made is that of determining where the cutting plane intersects with existing cross sections of the roadway model. A variety of methods/functions may be used to determine the intersection locations. One exemplary method/function that may be used is described in "Strip Trees: A Hierarchical Representation for Curves", by Dana H. Ballard, Commun. ACM 24, 5 (May 1981), pages 310-321, which article is fully incorporated by reference herein. In the prior art, no cross sections were displayed at the points of intersection. However, once the regions of intersection have been identified, embodiments of the present invention create a solid model at those regions (e.g., step 612 of FIG. 6 and step 806 of FIG. 8), slice the model (e.g., step 614 of FIG. 6), and display the slices accordingly (e.g., step 616 of FIG. 6).

At step 806, for the identified intersection regions, solids (e.g., created using a solid modeling kernel such as Autodesk™ Shape Manager™) that are fully capable of answering solid model queries are created. The creation process many involve using a special loft application programming interface (API) to loft a solid between design cross sections (that occur at regular intervals). Accordingly, a composite solid is assembled out of the pieces/regions that are determined to intersect the cutting plane line. For example, in a roadway model, there may be points, links and shapes that are assembled into a solid using a modeling utility. In this regard, the cutting plane line lies between already defined cross sections. To define a new cross section at the cutting plane line, as no points, lines, and shapes exist at the cutting plane location, they must be interpolated. Points from the existing regular defined cross sections may be interconnected in a variety of manners to form the previously mentioned composite solid. One technique that may be used to create/interpolate the solid is using linear interpolation. However, embodiments of the invention are not limited to linear interpolation and other techniques may be used.

At step 808, the cutting plane is formed and used to perform a Boolean operation, the result of which is the desired cross section. In other words, based on the cutting plane line, a cutting plane is formed and used to slice/cut the solids that were created.

At step 810, the newly created section is translated back for display in a format useful to the user. For example, the display in FIG. 7B (in section 2) illustrates the display of the translated section.

Lofted Solid Labeling

In addition to the above, step 810 may further include the identification/labeling of points, links, and shapes that are displayed. Such labeling is done in a manner that allows the user to see this small slice of the model in the context of the entire model. In this regard, it is typical for users to label various elements of input sections (e.g., the edge of a roadway point, the top surface of the road, etc.). Embodiments of the invention may use a progenitor mechanism in a shape manager loft API to identify these features in the generated sectional view. For example, a particular point in a cross section may be labeled (e.g., adjusted pavement, specific centerline of road, etc.). When the cross section is cut along an arbitrary plane (i.e., the cutting plane line), users may expect the points in the new cross section to be labeled as well (e.g. in the 3D view).

In the prior art, if an existing cross section had marked points, and the cutting plane lined up, the labeling was carried over. However, if the cutting plane did not align with existing cross sections, labeling was lost. Embodiments of the present invention overcome the inability to label such points. In other words, when a cross section is cut along an arbitrary plane, even if points in the cross section are interpolated, such parts may be accurately labeled.

Lofted Solid Processing

To provide the labeling functionality, a lofted solid may be processed to add attributes based on the input cross section. In this regard, if two adjacent cross sections both have points/labels "A" when the solid is created/processed at step 806, the two points are connected. The line connecting these two points is labeled "A." When the cutting plane cuts the line connecting the two points, the result is a single point that is labeled "A" (based on the line "A").

Figure 9A:
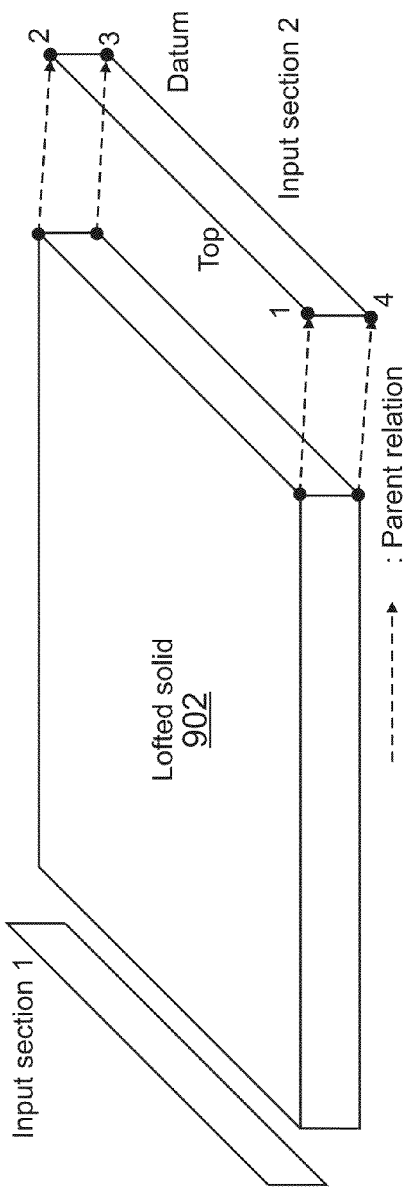
FIG. 9A illustrates a Lofted Solid with two cross sections (Input Section 1 and Input Section 2) that have various labels (1, 2, 3, 4, Top, and Datum) in accordance with one or more embodiments of the invention.
Figure 9B:
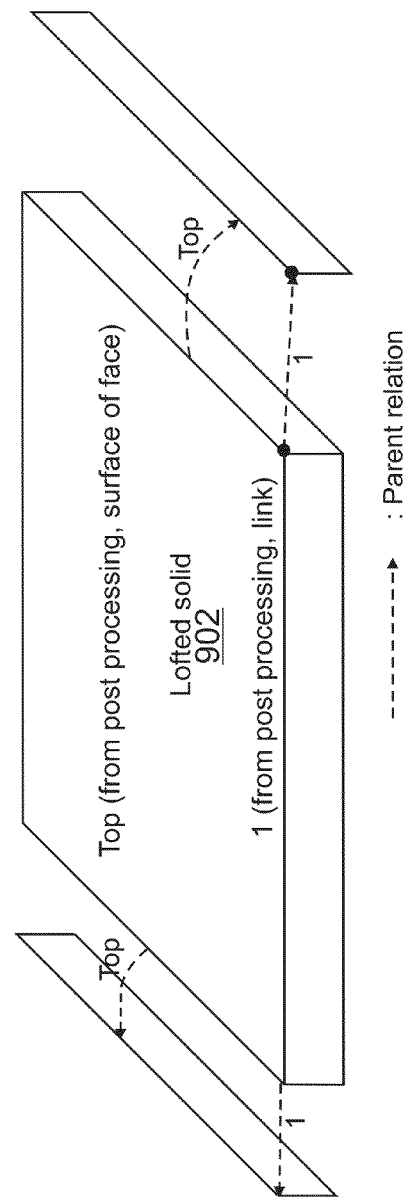
FIG. 9B illustrates the processing of the Lofted Solid of FIG. 9A to label the various components of the Lofted Solid in accordance with one or more embodiments of the invention.

FIG. 9A illustrates a Lofted Solid with two cross sections (Input Section 1 and Input Section 2) that have various labels (1, 2, 3, 4, Top, and Datum) in accordance with one or more embodiments of the invention. The Lofted Solid 902 has been created/interpolated based on the two input cross sections. The Lofted Solid 902 has a parent relation to the Input Section 2 as indicated by the dashed lines and arrows. Accordingly, the Lofted Solid 902 has points/faces/labels that correspond with (are parents of) the Input Section 2 (e.g., points 1, 2, 3, 4, and "Top"). FIG. 9B illustrates the processing of the Lofted Solid 902 to label the various components of the solid 902 in accordance with one or more embodiments of the invention. For faces, if all parent links for a face have the same attribute (and excluding those links [e.g., longitudinal links] that do not have any attribute), the face is marked with the same attribute. Accordingly, the "Top" of the Lofted Solid 902 is labeled from the post processing, surface or face (i.e., based on input section 1 and input section 2).

For links/edges, if the parent of the two vertices of a link have the same attribute, the link is marked with the same attribute. Thus, the link between point 1 on Input Section 1 and Input section 2 are all marked with the label "1" as illustrated.

Attribute Assignment

The links and points on the resulting cut section are given attributes by looking at the parent edges and faces on the lofted solid from which they originated.

Thus, any time there is a link in the solid model that connects two identical points, the link also acquires/is assigned with the same label (i.e., from the parent edges and faces on the lofted solid from which they originated) (as illustrated in FIG. 9B). FIG. 9C illustrates a cut of a cross section that acquires labels based on a parent relationship in accordance with one or more embodiments of the invention. In FIG. 9C, the user has defined a cut line—the sample line cutting plane. The cutting plane does not line up with existing cross sections but it is still desirable to label the faces/edges/vertices of the sample line cutting plane.

To mark edges in the resulting section, the parent face on the lofted solid is examined and the edge is marked if the parent has an attribute. In FIG. 9C, the parent face (i.e., of the Lofted Solid 902) is labeled "Top". Accordingly, the top of the cutting plane may be similarly labeled "Top". To mark vertices, if the parent is an edge and has an attribute, the vertex is marked with that attribute/label. Thus, since the parent (i.e., edge "1") of the Lofted Solid 902 is an edge, the intersection of the cutting plane with that vertex (i.e., at point 904) is also labeled with the "1".

In view of the above, any time there is a link in the model that connects two identical points, the length gets the same label (e.g., the link "1" in FIG. 9B). Similarly, once a cross section is cut, if the point happens to be on a line, the point is also assigned the same name (e.g., "1" in FIG. 9C). Thus, referring to FIG. 9A and 9B, the solids (e.g., Lofted Solid 902) created at step 806 may be based on two predefined cross sections of the roadway infrastructure model (e.g., input section 1 and 2). Such cross sections may have various points, edges, and faces with the same labels (e.g., input section 1 and input section 2 may both have edges labeled "Top" and vertices labeled "1," "2," "3," and "4") (see FIG. 9B). When the Lofted Solid 902 is created, the links that connect points having the same label are proscribed with the same label as the points (e.g., label "1"). Faces created/having edges with the same labels are similarly labeled with the same label as the edges (e.g., label "Top"). Further, solids that have parent faces (from the two cross sections) are labeled with the same label as those faces (not shown in FIGS. 9A or 9B).

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for generating a cross section for a roadway infrastructure model comprising:
    drawing a cutting plane line on the roadway infrastructure model at an arbitrary location;
    determining portions of the roadway infrastructure model that intersect the cutting plane line;
    creating one or more solids at the determined portions, wherein the one or more solids are fully capable of answering solid model queries;
    forming the cross section by slicing the one or more solids based on the cutting plane line; and
    displaying the cross section.

2. The computer-implemented method of claim 1, wherein spatial partitioning along an alignment of the roadway infrastructure model is used to determine portions of the roadway infrastructure model that intersect the cutting plane line.

3. The computer-implemented method of claim 1, wherein the one or more solids are created between two or more cross sections that occur at regular intervals.

4. The computer-implemented method of claim 1, wherein the arbitrary location lies between already defined cross sections.

5. The computer-implemented method of claim 4, wherein the creating one or more solids at the determined portions comprises linear interpolating points based on the already defined cross sections.

6. The computer-implemented method of claim 1, wherein:
    the one or more solids are based on a first predefined cross section and a second predefined cross section of the roadway infrastructure model;
    the first predefined cross section comprises a first point having a first label;
    the second predefined cross section comprises a second point having the first label that is the same as that of the first point;

a link of the or more solids that connects the first point and the second point is labeled with the first label;
an intersection between the cross section and the link comprises a third point; and
the third point is labeled with the first label in the display of the cross section.

7. The computer-implemented method of claim 1, wherein:
the one or more solids are based on a first predefined cross section and a second predefined cross section of the roadway infrastructure model;
the first predefined cross section comprises a first edge having a first label;
the second predefined cross section comprises a second edge having the first label that is the same as that of the first edge;
a face of the or more solids that connects the first edge and the second edge is labeled with the first label;
an intersection between the cross section and the face comprises a third edge; and
the third edge is labeled with the first label in the display of the cross section.

8. The computer-implemented method of claim 1, wherein:
the one or more solids are based on a first predefined cross section and a second predefined cross section of the roadway infrastructure model;
the first predefined cross section comprises a first face having a first label;
the second predefined cross section comprises a second face having the first label that is the same as that of the first face;
one of the one or more solids that connects the first face and the second face is labeled with the first label;
an intersection between the cross section and the one or more solid comprises a third face; and
the third face is labeled with the first label in the display of the cross section.

9. An apparatus for generating a cross section for a roadway infrastructure model in a computer system comprising:
(a) a computer having a memory;
(b) an application executing on the computer, wherein the application is configured to:
(i) draw a cutting plane line on the roadway infrastructure model at an arbitrary location;
(ii) determine portions of the roadway infrastructure model that intersect the cutting plane line;
(iii) create one or more solids at the determined portions, wherein the one or more solids are fully capable of answering solid model queries;
(iv) form the cross section by slicing the one or more solids based on the cutting plane line; and
(v) display the cross section.

10. The apparatus of claim 9, wherein spatial partitioning along an alignment of the roadway infrastructure model is used to determine portions of the roadway infrastructure model that intersect the cutting plane line.

11. The apparatus of claim 9, wherein the one or more solids are created between two or more cross sections that occur at regular intervals.

12. The apparatus of claim 10, wherein the arbitrary location lies between already defined cross sections.

13. The apparatus of claim 12, wherein the application is configured to create the one or more solids at the determined portions by linear interpolating points based on the already defined cross sections.

14. The apparatus of claim 9, wherein:
the one or more solids are based on a first predefined cross section and a second predefined cross section of the roadway infrastructure model;
the first predefined cross section comprises a first point having a first label;
the second predefined cross section comprises a second point having the first label that is the same as that of the first point;
a link of the or more solids that connects the first point and the second point is labeled with the first label;
an intersection between the cross section and the link comprises a third point; and
the third point is labeled with the first label in the display of the cross section.

15. The apparatus of claim 9, wherein:
the one or more solids are based on a first predefined cross section and a second predefined cross section of the roadway infrastructure model;
the first predefined cross section comprises a first edge having a first label;
the second predefined cross section comprises a second edge having the first label that is the same as that of the first edge;
a face of the or more solids that connect the first edge and the second edge is labeled with the first label;
an intersection between the cross section and the face comprises a third edge; and
the third edge is labeled with the first label in the display of the cross section.

16. The apparatus of claim 9, wherein:
the one or more solids are based on a first predefined cross section and a second predefined cross section of the roadway infrastructure model;
the first predefined cross section comprises a first face having a first label;
the second predefined cross section comprises a second face having the first label that is the same as that of the first face;
one of the one or more solids that connects the first face and the second face is labeled with the first label;
an intersection between the cross section and the one or more solid comprises a third face; and
the third face is labeled with the first label in the display of the cross section.

17. A non-transitory computer readable storage medium encoded with computer program instructions which when accessed by a computer cause the computer to load the program instructions to a memory therein creating a special purpose data structure causing the computer to operate as a specially programmed computer, executing a method of generating a cross section for a roadway infrastructure model, comprising:
drawing, in the specially programmed computer, a cutting plane line on the roadway infrastructure model at an arbitrary location;
determining, in the specially programmed computer, portions of the roadway infrastructure model that intersect the cutting plane line;
creating, in the specially programmed computer, one or more solids at the determined portions, wherein the one or more solids are fully capable of answering solid model queries;
forming, in the specially programmed computer, the cross section by slicing the one or more solids based on the cutting plane line; and displaying, in the specially programmed computer, the cross section.

18. The computer readable storage medium of claim 17 wherein spatial partitioning along an alignment of the roadway infrastructure model is used to determine portions of the roadway infrastructure model that intersect the cutting plane line.

19. The computer readable storage medium of claim 17, wherein the one or more solids are created between two or more cross sections that occur at regular intervals.

20. The computer readable storage medium of claim 17, wherein the arbitrary location lies between already defined cross sections.

21. The computer readable storage medium of claim 20, wherein the creating one or more solids at the determined portions comprises linear interpolating points based on the already defined cross sections.

22. The computer readable storage medium of claim 17, wherein:
the one or more solids are based on a first predefined cross section and a second predefined cross section of the roadway infrastructure model;
the first predefined cross section comprises a first point having a first label;
the second predefined cross section comprises a second point having the first label that is the same as that of the first point;
a link of the or more solids that connects the first point and the second point is labeled with the first label;
an intersection between the cross section and the link comprises a third point; and
the third point is labeled with the first label in the display of the cross section.

23. The computer readable storage medium of claim 17, wherein:
the one or more solids are based on a first predefined cross section and a second predefined cross section of the roadway infrastructure model;
the first predefined cross section comprises a first edge having a first label;
the second predefined cross section comprises a second edge having the first label that is the same as that of the first edge;
a face of the or more solids that connects the first edge and the second edge is labeled with the first label;
an intersection between the cross section and the face comprises a third edge; and
the third edge is labeled with the first label in the display of the cross section.

24. The computer readable storage medium of claim 17, wherein:
the one or more solids are based on a first predefined cross section and a second predefined cross section of the roadway infrastructure model;
the first predefined cross section comprises a first face having a first label;
the second predefined cross section comprises a second face having the first label that is the same as that of the first face;
one of the one or more solids that connects the first face and the second face is labeled with the first label;
an intersection between the cross section and the one or more solid comprises a third face; and
the third face is labeled with the first label in the display of the cross section.

\* \* \* \* \*

UNITED STATES PATENT AND TRADEMARK OFFICE
CERTIFICATE OF CORRECTION

PATENT NO. : 9,035,938 B2
APPLICATION NO. : 13/269335
DATED : May 19, 2015
INVENTOR(S) : Anandaraja Devan et al.

It is certified that error appears in the above-identified patent and that said Letters Patent is hereby corrected as shown below:

In the claims

Column 11

Lines 1-2 delete the text, "a link of the or more solids that connects the first point and the second point is labeled with the first label;"

and insert the text, --a link of the one or more solids that connects the first point and the second point is labeled with the first label;--

Column 11

Lines 16-17 delete the text, "a face of the or more solids that connects the first edge and the second edge is labeled with the first label;"

and insert the text, --a face of the one or more solids that connects the first edge and the second edge is labeled with the first label;--

Column 11

Lines 62-63 delete the text, "12. The apparatus of claim 10, wherein the arbitrary location lies between already defined cross sections."

and insert the text, --12. The apparatus of claim 9, wherein the arbitrary location lies between already defined cross sections.--

Signed and Sealed this
Fifth Day of July, 2016

Michelle K. Lee
*Director of the United States Patent and Trademark Office*

CERTIFICATE OF CORRECTION (continued)
U.S. Pat. No. 9,035,938 B2

In the claims

Column 12

Lines 10-11 delete the text, "a link of the or more solids that connects the first point and the second point is labeled with the first label;"

and insert the text, --a link of the one or more solids that connects the first point and the second point is labeled with the first label;--

Column 12

Lines 26-27 delete the text, "a face of the or more solids that connect the first edge and the second edge is labeled with the first label;"

and insert the text, --a face of the one or more solids that connect the first edge and the second edge is labeled with the first label;--

Column 13

Lines 28-29 delete the text, "a link of the or more solids that connects the first point and the second point is labeled with the first label;"

and insert the text, --a link of the one or more solids that connects the first point and the second point is labeled with the first label;--

Column 14

Lines 11-12 delete the text, "a face of the or more solids that connects the first edge and the second edge is labeled with the first label;"

and insert the text, --a face of the one or more solids that connects the first edge and the second edge is labeled with the first label;--